United States Patent [19]

Ibuchi

[11] Patent Number: 4,962,402

[45] Date of Patent: Oct. 9, 1990

[54] PRESSURE DEVICE FOR USE IN IMAGE FORMING APPARATUSES

[75] Inventor: Yoshiaki Ibuchi, Nara, Japan

[73] Assignee: Sharp Kabushiki Kaisha, Osaka, Japan

[21] Appl. No.: 411,673

[22] Filed: Sep. 25, 1989

[30] Foreign Application Priority Data

Sep. 26, 1988 [JP] Japan .................. 63-125524[U]

[51] Int. Cl.$^5$ ............... G03B 27/32; G03B 27/52
[52] U.S. Cl. ................................. 355/27; 354/304
[58] Field of Search .............. 355/27; 354/301–304, 354/319, 297; 430/138, 211; 428/402.2, 402.21, 402.22

[56] References Cited

U.S. PATENT DOCUMENTS 4,714,943  12/1987  Sakakibara et al. ............ 355/27

Primary Examiner—Richard A. Wintercorn
Attorney, Agent, or Firm—Irell & Manella

[57] ABSTRACT

A pressure device for use in image forming apparatuses comprises a pair of pressure rollers by which a media sheet with microcapsules encapsulating a colorless dye and a light-curable agent which hardens by exposure to light is pressed together with an image receiving sheet with a developing agent having a chromogenic effect on the colorless dye after the media sheet is exposed to an image-forming light, a pair of guides by which the pair of rollers are rotatably supported, the pair of guides being rotatable at one end relative to each other about a fulcrum, a roller-pressing means that is installed through the guides, said roller-pressing means pressing the pair of rollers to be pressed against each other, and a pressure changing means that is installed on both the guides, the pressure-changing means changing pressure to be applied to the rollers by the roller-pressing means according to the length of the image receiving sheet that is measured in the direction perpendicular to the transporting direction of the image receiving sheet.

3 Claims, 5 Drawing Sheets

FIG.3
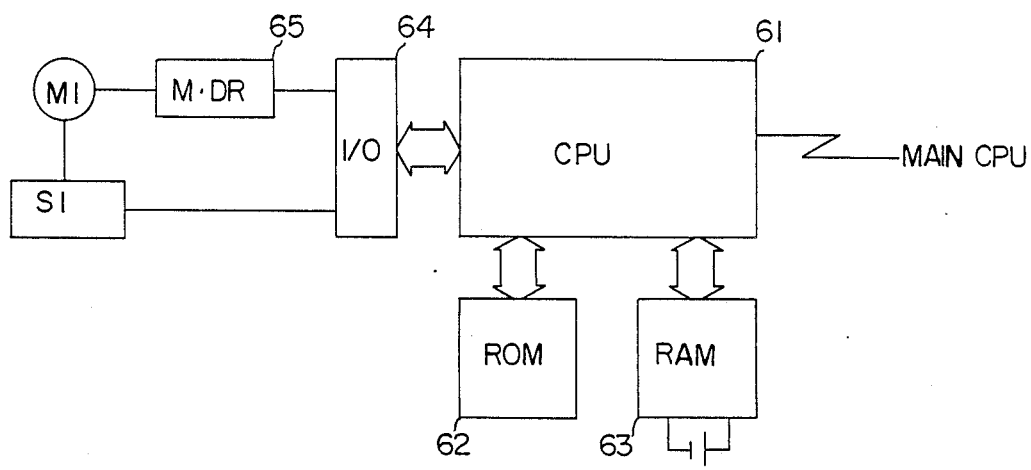
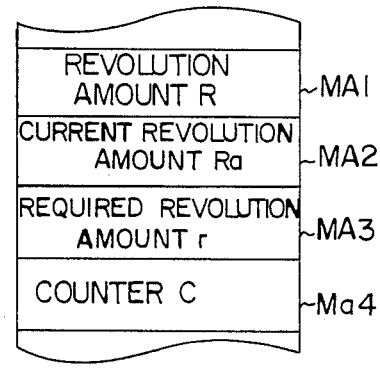
FIG.4
| SHEET SIZE | REVOLUTION AMOUNT R |
|---|---|
| A3 | 0 |
| B4 | r1 |
| A4 | r2 |
| B5 | r3 |
FIG.5
| REVOLUTION AMOUNT R | ~MA1 |
| CURRENT REVOLUTION AMOUNT Ra | ~MA2 |
| REQUIRED REVOLUTION AMOUNT r | ~MA3 |
| COUNTER C | ~Ma4 |

PRESSURE DEVICE FOR USE IN IMAGE FORMING APPARATUSES

BACKGROUND OF THE INVENTION

1. Field of the invention:

This invention relates to a pressure device for use in image forming apparatuses in which a media sheet that has been exposed to light is pressed together with an image receiving sheet to reproduce an image on the image receiving sheet.

2. Description of the Prior Art:

An image forming method is known in which a media sheet with a selectively hardened image formed thereon by photosensitive microcapsules exposed to image light is pressed together with an image receiving sheet coated with developer, whereby unhardened photosensitive microcapsules contained in the media sheet are ruptured, causing encapsulated colorless dyes to flow out and react with the developer to reproduce an image on the image receiving sheet that corresponds to an image of the original. Generally, in an image forming apparatus using such image forming method, a pair of rollers are used as a pressure device for pressing the media sheet together with the image receiving sheet. Since a line pressure of about 90 kg/cm is needed for the pressure device to rupture the unhardened photosensitive microcapsules on the media sheet, the pair of rollers are pressed against each other with a large pressure applied to the ends thereof so as to achieve the required line pressure on the contact portion that is formed parallel with the axial direction of the rollers. On the other hand, to maintain good conditions for the formation of an image on the image receiving sheet, the pressure device must be so constructed that the media sheet is pressed against the image receiving sheet evenly over the entire surface thereof to prevent variations in the copy image density. This means that a uniform line pressure must be applied over the entire contact portion of the pair of rollers. Various ideas have been employed with regard to the roller materials, shapes and other structural improvements, such as the provision of a lower roller with a hollow construction, so that the line pressure acting on the rollers, the ends of which a large pressure is applied, to be kept within the allowable limits to prevent the deflection of the rollers.

However, conventional pressure devices for an image forming apparatus have been so constructed that sheets with a width corresponding to the length of the entire contact portion of the rollers pass through the said entire contact portion and that a designated line pressure is obtained over the entire contact portion of the rollers, which makes it difficult to handle an increase in the line pressure due to the stress concentration caused when an image receiving sheet of a different size is passed between the rollers. That is, as shown in FIG. 7, when an image receiving sheet 73 of a smaller size passes between the upper and lower rollers 71 and 72, the force F that is applied to the ends of the rollers 71 and 72 acts on the upper and lower rollers 71 and 72 along the length perpendicular to the transporting direction of the image receiving sheet 73, thus resulting in an increased line pressure per unit length. This may cause the line pressure acting on the rollers 71 and 72 to exceed the maximum design limit (the allowable limit within which deflection is not caused), deflecting the rollers 71 and 72 with the sides of the image receiving sheet 73 as the fulcrums. The deflection prevents the contact portions of the upper and lower rollers 71 and 72 from aligning parallel with each other, resulting in a smaller line pressure acting perpendicularly to the image receiving sheet 73 and media sheet 74 on the areas adjacent to the sides of the image receiving sheet 73 as compared with the center areas thereof, thus preventing uniform line pressure from being applied over the entire surface of the image receiving sheet 73, which causes variations in the copy image density. The conventional pressure devices have had a further problem in that, because the line pressure acting on the image receiving sheet 73 and media sheet 74 is biased (with respect to the direction along the surface), a force in the direction along the surface is caused as a component force of the line pressure, thus creating creases in the media sheet 74, as well as the image receiving sheet 73.

SUMMARY OF THE INVENTION

The pressure device for use in image forming apparatuses of this invention, which overcomes the above-discussed and numerous other disadvantages and deficiencies of the prior art, comprises a pair of pressure rollers by which a media sheet with microcapsules encapsulating a colorless dye and a light-curable agent which hardens by exposure to light is pressed together with an image receiving sheet with a developing agent having a chromogenic effect on said colorless dye after said media sheet is exposed to an image-forming light, a pair of guides by which the pair of rollers are rotatably supported, the pair of guides being rotatable at one end relative to each other about a fulcrum, a roller-pressing means that is installed through said guides, said roller-pressing means pressing the pair of rollers to be pressed against each other, and a pressure changing means that is installed on both the guides, said pressure-changing means changing pressure to be applied to said rollers by said roller-pressing means according to the length of said image receiving sheet that is measured in the direction perpendicular to the transporting direction of said image receiving sheet.

In a preferred embodiment, the roller-pressing means a bolt that is installed through said guides and a spring that is fitted on the portion of said bolt that is exposed below one of said guides.

In a preferred embodiment, the pressure changing means comprises a lift that is disposed between the pair of guides, said lift having parallel links, the spacing of which is variable by the rotation of a screw connected to a motor, and supporting bars that support said parallel links, said screw being threaded through one end of each supporting bar, the other end of each of which is pivoted at said parallel links.

Thus, the invention described herein makes possible the objective of providing a pressure device for image forming apparatuses, which is capable of changing the pressure applied to a pair of rollers of the pressure device according to the length of an image receiving sheet (i.e., the length of an image receiving sheet in the axial direction of the rollers) passing between the rollers so that an almost constant line pressure can always be applied regardless of the size of the image receiving sheet, thereby preventing the deflection of the rollers, thus, preventing variations in the copy image density, and also, preventing creation of creases in the image receiving sheet as well as the media sheet itself.

BRIEF DESCRIPTION OF THE DRAWINGS

This invention may be better understood and its numerous objects and advantages will become apparent to those skilled in the art by reference to the accompanying drawings as follows:

FIG. 3 is a block diagram of the control section of the pressure device for the above image forming apparatus.

FIG. 4 is a chart showing the relationship between the sheet size and the motor revolution amount R, which is stored in a ROM which forms part of the control section of the above pressure device.

FIG. 5 is a memory map for the major areas of a RAM which forms part of the control section of the pressure device.

DESCRIPTION OF THE PREFERRED EMBODIMENTS

This invention provides a pressure device, in which the pressure applied to a media sheet and an image receiving sheet is changed according to the length of the image receiving sheet, the length being measured in the direction perpendicular to the transporting direction thereof. Accordingly, even when an image receiving sheet with a shorter length in the direction perpendicular to the transporting direction thereof is fed into the pressure device, the line pressure acting on the media sheet and image receiving sheet will not substantially increase, and thus, no structural deformation will be caused to the pressure device.

Figure 1:
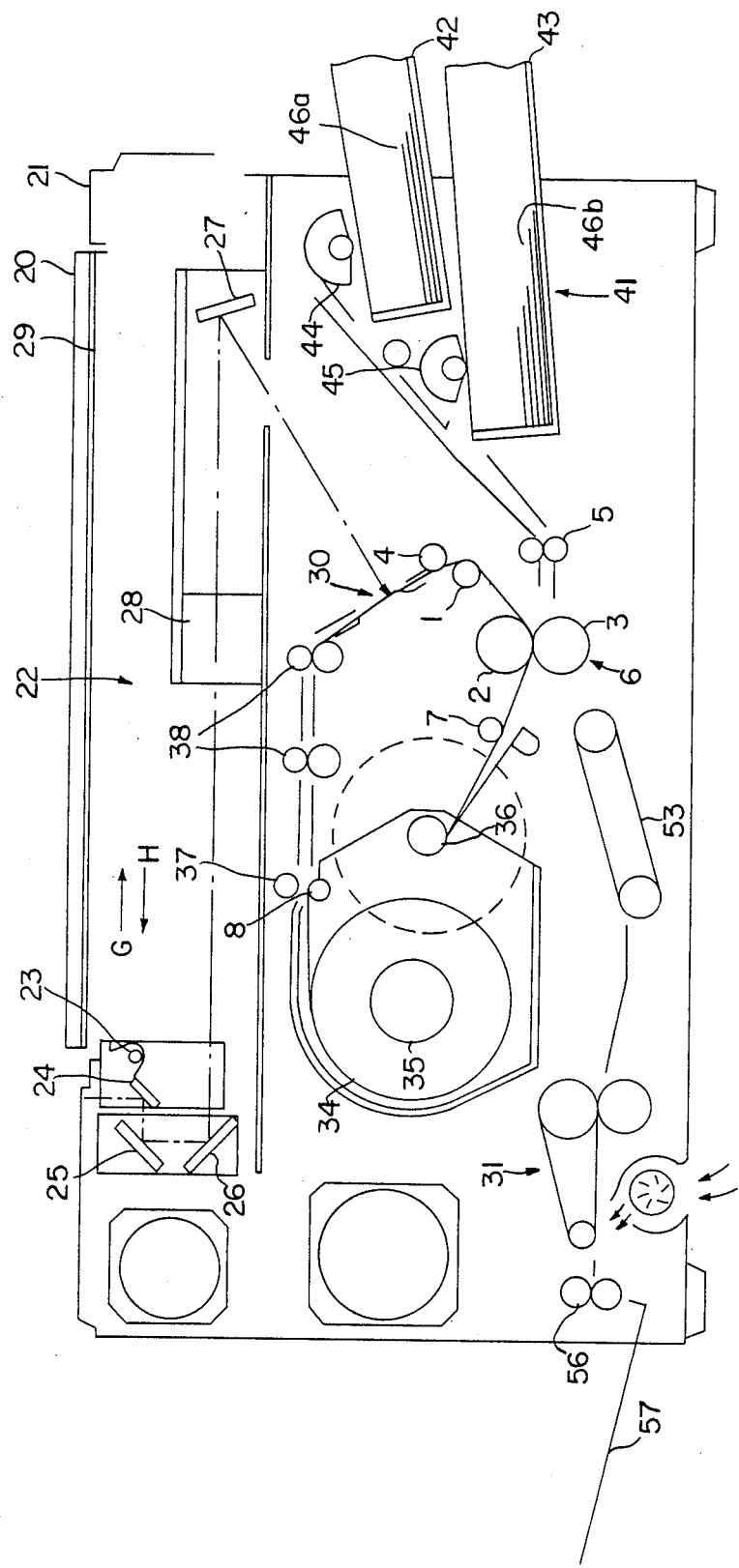
FIG. 1 is a front sectional view showing an image forming apparatus provided with a pressure device of this invention.

FIG. 1 shows an image forming apparatus provided with a pressure device of this invention. In the middle portion inside of an image forming apparatus 21, a media sheet 34 is accommodated in a rolled form wound on a supply shaft 35. A sheet transport path is formed comprising rollers 8, 37, 38, 4 and 1 from the position where the media sheet 34 is accommodated to a pressure transfer section 6 through an exposure section 30. After passing the pressure transfer section 6, the media sheet 34 is taken up on the take-up shaft 36 by means of a roller 7. On one side of the image forming apparatus are mounted paper cassettes 42 and 43. The paper cassettes 42 and 43 hold image receiving sheets 46a and 46b of different sizes respectively, and are provided with paper feed rollers 44 and 45 to form a paper feed section 41. In an image forming operation, the paper feed roller 44 or 45, whichever selected, is made to rotate, and the image receiving sheet 46a or 46b is fed to the pressure transfer section 6 via a resist roller 5. The image receiving sheet 46a (or 46b) is pressed together with the media sheet 34 by means of pressure rollers 2 and 3 at the pressure transfer section 6. After passing the pressure transfer section 6, the image receiving sheet 46a (or 46b) is transported on a transport belt 53 to a glossing unit 31, where the image is given glossiness, before being discharged by a paper exit roller 56 to a paper exit tray 57.

Provided on the top surface of the image forming apparatus 21 is an original table 29 made of hard, transparent glass. The upper surface of the original table 29 is capable of being covered by an original cover 20. Disposed beneath the original table 29 is an optical system 22 comprising a light source 23, mirrors 24-27, and a lens 28. The light source 23 and mirrors 24-27 in the optical system 22 move under the original table 29 in the directions shown by arrows G and H during image forming operation to scan an original placed on the original table 29 by the light of the light source 23. The light of the light source 23 reflected by the original is projected through the mirrors 24-27 and the lens 28 onto the exposure section 30 to expose the media sheet 34. Through the exposure in the exposure section 30, a selectively hardened image of photosensitive microcapsules is formed on the media sheet 34, and the photosensitive microcapsules in the unhardened areas of the selectively hardened image are ruptured in the pressure transfer section 6. Rupturing of the photosensitive microcapsules causes the colorless dyes encapsulated therein to flow out onto the image receiving sheet 46a (or 46b), the colorless dyes being given colors by reacting with the developer of the image receiving sheet to reproduce an image on the image receiving sheet 46a (or 46b).

Figure 2:
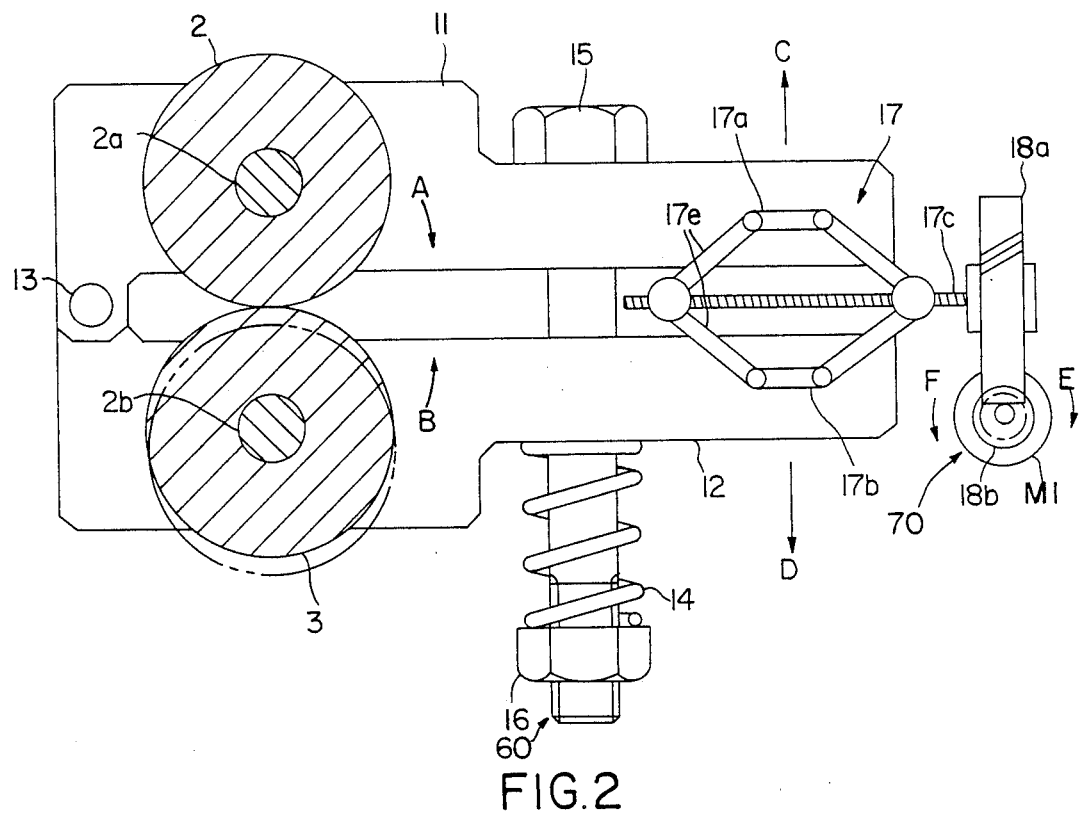
FIG. 2 is a front sectional view showing the pressure device of FIG. 1.

FIG. 2 shows the construction of the pressure device of the above image forming apparatus, which comprises the pair of rollers 2 and 3, a pair of guides 11 and 12, a roller-pressing means 60 that is constituted of a bolt 15 and a spring 14, and a pressure-changing means 70 that is constituted by a lift 17.

The upper and lower pressure rollers 2 and 3 are rotatably supported to an upper guide 11 and a lower guide 12 via shafts 2a and 2b, respectively. The upper guide 11 and the lower guide 12 are rotatable at one end relative to each other about a fulcrum 13. Through the other end of each of the upper guide 11 and the lower guide 12, a bolt 15 is mounted from above. On the portion of the bolt 15 that is exposed below the lower guide 12, a spring 14 is fitted, with a nut 16 also screwed thereon. Disposed between the upper guide 11 and the lower guide 12 is a lift 17 with parallel links 17a and 17b whose spacing is variable by the rotation of a screw 17c. The lift 17 also has supporting bars 17e that support these parallel links 17a and 17b. The screw 17c is threaded through one end of each supporting bar 17e. The other end of each supporting bar 17e is pivoted at the parallel links 17a and 17b. The parallel links 17a and 17b of the lift 17 are fixed to the upper guide 11 and the lower guide 12, respectively. Mounted on one end of the screw 17c is a worm gear 18a which is engaged with a worm roller 18b fixed to the rotor shaft of a motor M1.

In the above construction, the upper guide 11 and lower guide 12 with the pressure rollers 2 and 3 supported thereto are urged in the directions shown by arrows A and B with the fulcrum 13 as the point of support by the resilient force of the spring 14. When the motor M1 is rotated in the forward direction (i.e., clockwise), as shown by arrow E, the parallel links 17a and 17b of the lift 17 move in the directions C and D, respectively, to widen their spacing. This serves to weaken the force of the spring 14 acting on the pressure rollers 2 and 3. On the other hand, rotating the motor M1 in the reverse direction (i.e., anti clockwise), as shown by arrow F serves to narrow the spacing of the parallel links 17a and 17b, thus increasing the pressing force of the pressure rollers 2 and 3.

FIG. 3 is a block diagram of the control section of the pressure device for the above image forming apparatus.

A motor driver 65 is connected to a CPU 61 via an I/O interface 64. The motor M1 is connected to the motor driver 65. The rotation of the motor M1 is detected by a sensor S1. The sensor S1 is formed, for example from a photocoupler, to detect the slits formed in a disk fixed to the rotor shaft of the motor M1, and outputs detection data to the CPU 61 for each revolution of the motor M1. The CPU 61 outputs control data to the motor driver 65 in accordance with a program stored in a ROM 62. As shown in FIG. 5, memory areas MA1-MA3 in a RAM 63 are allocated for storing a revolution amount R, a current revolution amount Ra, and a required revolution amount r respectively, with a memory area MA4 allocated to a counter C. The RAM 63 is backed up by a battery, thus retaining the contents therein even when power is turned off to the image forming apparatus 21. Moreover, the CPU 61 transfers data to and from a main CPU provided in the image forming apparatus 21.

Figure 6:
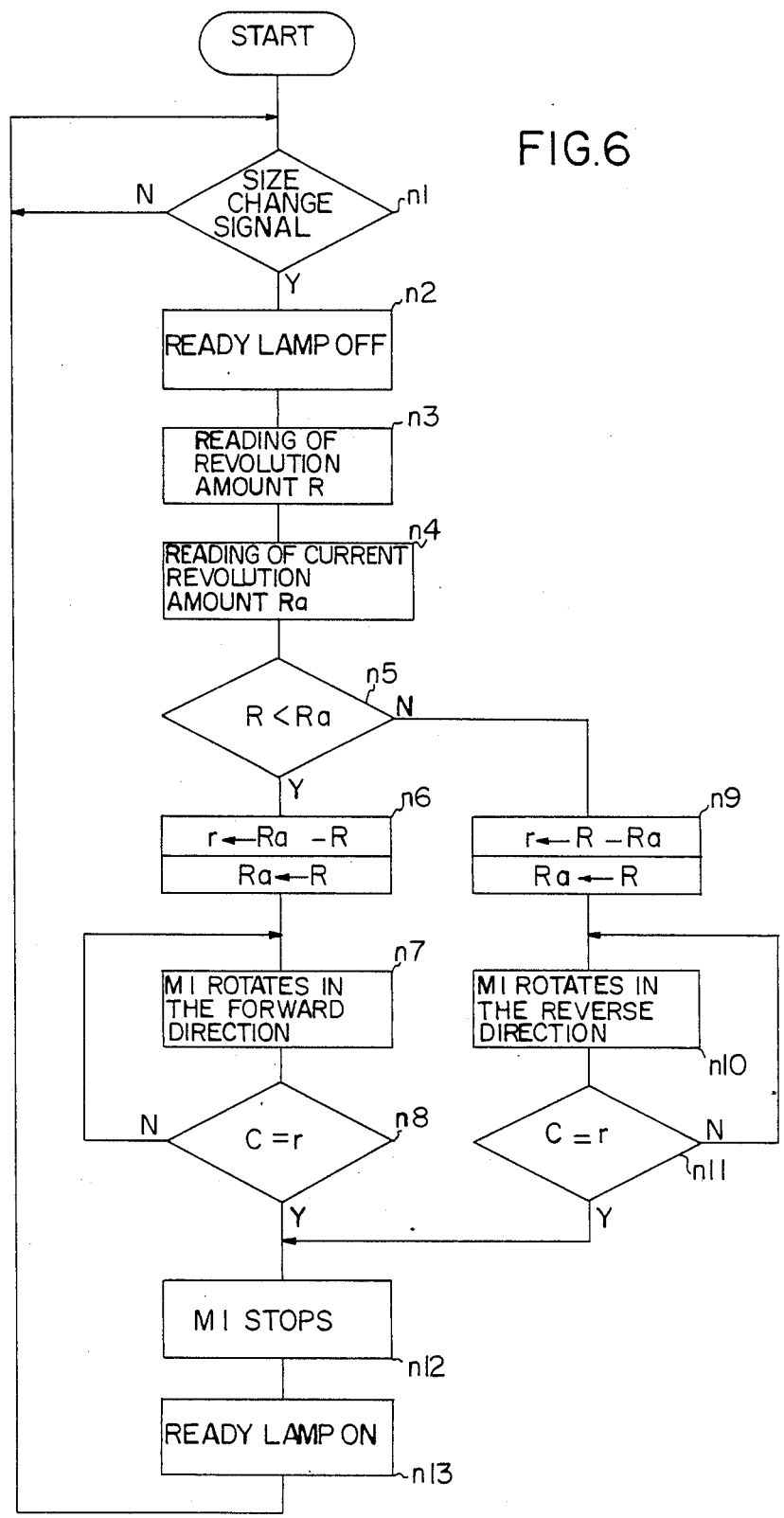
FIG. 6 is a flowchart showing the processing sequence of the control section of the pressure device.
Figure 7:
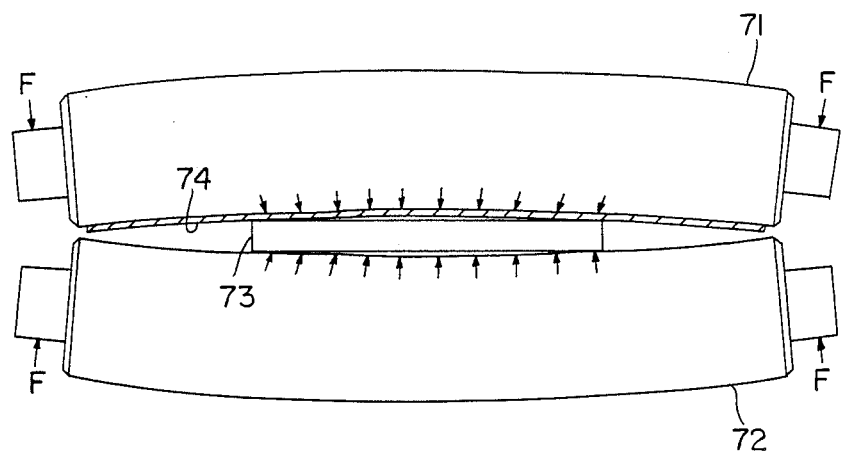
FIG. 7 is a schematic side view showing how the force is acting in a conventional pressure device.

FIG. 6 is a flowchart showing the processing sequence of the control section of the pressure device for the above image forming apparatus.

When the power is turned on, the CPU 61 becomes ready to receive a size change signal from the main CPU (n1). The main CPU sends out the size change signal to the CPU 61 when a selector key for the image receiving sheet size on an operation panel (not shown) is operated. When the size change signal is received, the CPU 61 sends out a signal to the main CPU to turn off the ready lamp on the operation panel (n2), while reading from the ROM 62 the revolution amount R of the motor M1 for the selected size (n3). The ROM 62 has the relationship between the size of the image receiving sheet and the revolution amount of the motor M1, as shown in FIG. 4, stored in its memory. In FIG. 4, the revolution amount R indicates the number of revolutions of the motor M1 in the direction of the arrow E (as shown in FIG. 2), where r1<r3. The spacing of the parallel links 17a and 17b in the lift 17 changes according to the number of revolutions of the motor M1 in the direction of the arrow E. As the number of revolutions of the motor M1 in the direction E increases, the parallel links 17a and 17b, the upper guide 11, and the lower guide 12, are set at a wider spacing, thus reducing the pressing force of the pressure rollers 2 and 3. The CPU 61 stores the revolution amount R into the memory area MA1 in the RAM 63.

Next, the CPU 61 reads out the current revolution amount Ra of the motor M1 stored in the memory area MA2 in the RAM 63 (n4), and compares the current revolution amount Ra with the revolution amount R for the selected size (n5). When the revolution amount R for the selected size is smaller than the current revolution amount Ra, the CPU 61 sets the value obtained by subtracting the revolution amount r from the current revolution amount Ra as the required revolution amount R, and stores it into the memory area MA3 in the RAM 63, while storing the revolution amount R into the memory area MA2 as the value for the current revolution amount Ra (n6). Thereafter, the motor M1 is rotated in a forward direction as shown by the arrow A, till the contents of the counter C agree with the required revolution amount r(n7, n8). When the contents of the counter C agree with the required revolution amount r, the CPU 61 stops the rotation of the motor M1 (n12), and sends out a signal to the main CPU to turn on the ready lamp (n13).

On the other hand, when the revolution amount R for the selected size is greater than the current revolution amount Ra, the CPU 61 sets the value obtained, by subtracting the current revolution amount Ra from the revolution amount R as the required revolution amount r, while storing the value of the revolution amount R into the memory areas MA2 as the current revolution amount Ra (n9). Thereafter, the motor M1 is rotated in the reverse direction (i.e., anti clockwise), as shown by the arrow F till the contents of the counter C agree with the required revolution amount r (n10, n11).

As described above, according to this embodiment, at each change of the size of the image receiving sheet for the formation of an image, the pressing force of the pressure rollers 2 and 3 is changed according to the size of the image receiving sheet. The pressing force of the pressure rollers 2 and 3 is determined by the revolution amount R of the motor M1. The revolution amount R has the relationship with the size of the image receiving sheet as shown in FIG. 4, and the revolution amount R of the motor M1 increases with the decrease in the sheet size. When the transporting direction of the image receiving sheet is fixed, the length measured across the sheet in the direction perpendicular to the transporting direction becomes shorter as the sheet size becomes smaller. In accordance with the sheet size, the revolution amount R of the motor M1 in the direction E increases to reduce the pressing force of the pressure rollers 2 and 3. Thus, the line pressure per unit length can always be maintained almost constant with respect to the direction perpendicular to the transporting direction of the image receiving sheet regardless of the sheet size, thereby preventing the pressure rollers 2 and 3 from being deflected.

In this embodiment, the pressure device is so constructed that the pressing force of the pressure rollers 2 and 3 is changed when the size of the image receiving sheet is selected by the operator, but alternatively, a means can be provided in the transport path of the image receiving sheet for detecting the length of the image receiving sheet measured in the direction perpendicular to the transporting direction, whereby the pressing force of the pressure rollers 2 and 3 can be changed according to the results detected by this detecting means.

As mentioned above, according to the present invention, the pressure applied to the media sheet and the image receiving sheet is changed according to the length of the image receiving sheet for the formation of an image, the length being measured in the direction perpendicular to the transporting direction thereof. Thus, it is possible, regardless of the sheet size, to maintain an almost constant line pressure acting on unit length of the sheet measured in the direction perpendicular to the transporting direction thereof, thus eliminating the possibility of stress concentration when transporting a smaller size image receiving sheet, and preventing deflection and deformation from being caused to the pressure section generally comprising a pair of rollers. Accordingly, it is possible to apply a uniform pressure over the entire surface of the image receiving sheet, thus attaining reproduction of a clear copy image without density variations, while ensuring prevention of creases in the sheet by applying the pressure in the direction perpendicular to the direction along the surfaces of the image receiving sheet and media sheet without component force of the pressure exerting on the sheet surfaces.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A pressure device for use in image forming apparatuses comprising:

a pair of pressure rollers by which a media sheet with microcapsules encapsulating a colorless dye and a light-curable agent which hardens by exposure to light is pressed together with an image receiving sheet with a developing agent having a chromogenic effect on said colorless dye after said media sheet is exposed to an image-forming light, a pair of guides by which the pair of rollers are rotatably supported, the pair of guides being rotatable at one end relative to each other about a fulcrum, a roller-pressing means that is installed through said guides, said roller-pressing means pressing the pair of rollers to be pressed against each other, and a pressure changing means that is installed on both the guides, said pressure-changing means changing pressure to be applied to said rollers by said roller-pressing means according to the length of said image receiving sheet that is measured in the direction perpendicular to the transporting direction of said image receiving sheet.

2. A pressure device for use in image forming apparatuses according to claim 1, wherein said roller-pressing means a bolt that is installed through said guides and a spring that is fitted on the portion of said bolt that is exposed below one of said guides.

3. A pressure device for use in image forming apparatuses according to claim 1, wherein said pressure changing means comprises a lift that is disposed between the pair of guides, said lift having parallel links, the spacing of which is variable by the rotation of a screw connected to a motor, and supporting bars that support said parallel links, said screw being threaded through one end of each supporting bar, the other end of each of which is pivoted at said parallel links.

* * * * *